United States Patent
Itahashi et al.

(10) Patent No.: US 9,716,126 B2
(45) Date of Patent: Jul. 25, 2017

(54) METHOD OF MANUFACTURING SOLID-STATE IMAGE SENSOR

(71) Applicant: CANON KABUSHIKI KAISHA, Tokyo (JP)

(72) Inventors: Masatsugu Itahashi, Yokohama (JP); Nobuaki Kakinuma, Tokyo (JP); Mineo Shimotsusa, Machida (JP); Masato Fujita, Kitakyushu (JP); Yusuke Onuki, Fujisawa (JP); Takumi Ogino, Koganei (JP); Keita Torii, Yamato (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/726,769

(22) Filed: Jun. 1, 2015

(65) Prior Publication Data
US 2015/0364522 A1    Dec. 17, 2015

(30) Foreign Application Priority Data

Jun. 12, 2014 (JP) ................................ 2014-121849

(51) Int. Cl.
*H01L 27/146* (2006.01)
*H01L 21/28* (2006.01)
(Continued)

(52) U.S. Cl.
CPC .. *H01L 27/14689* (2013.01); *H01L 21/28035* (2013.01); *H01L 27/1463* (2013.01);
(Continued)

(58) Field of Classification Search
CPC ......... H01L 27/14689; H01L 27/14612; H01L 27/1463; H01L 29/6659
See application file for complete search history.

(56) References Cited

U.S. PATENT DOCUMENTS 7,488,637 B2    2/2009  Kim
7,920,192 B2    4/2011  Watanabe et al.
(Continued)

FOREIGN PATENT DOCUMENTS

JP    2006-165568 A    6/2006
JP    2007-158031 A    6/2007
(Continued)

OTHER PUBLICATIONS

Watanabe et al., U.S. Appl. No. 14/805,561, filed Jul. 22, 2015.

*Primary Examiner* — Kyoung Lee
*Assistant Examiner* — Mikka Liu
(74) *Attorney, Agent, or Firm* — Fitzpatrick, Cella, Harper & Scinto

(57) ABSTRACT

A method of manufacturing a solid-state image sensor includes forming a first element isolation and a first active region of a pixel area, and a second isolation and a second active region of a peripheral circuit area, forming a gate electrode film covering the first element isolation, the first active region, the second element isolation and the second active region, implanting an n-type impurity selectively into at least a part of the gate electrode film corresponding to the pixel area, and forming, after the implanting of the n-type impurity, a first gate electrode of the pixel area and a second gate electrode of the peripheral circuit area by patterning the gate electrode film. The part of the gate electrode film includes a portion located above a boundary between the first element isolation and the first active region.

20 Claims, 6 Drawing Sheets

(51) Int. Cl.
  *H01L 21/265* (2006.01)
  *H01L 29/66* (2006.01)
(52) U.S. Cl.
  CPC .. *H01L 27/14612* (2013.01); *H01L 21/26513*
         (2013.01); *H01L 29/6659* (2013.01)

(56) References Cited

U.S. PATENT DOCUMENTS

| | | |
|---|---|---|
| 7,935,557 B2 | 5/2011 | Mishima et al. |
| 7,947,522 B2 | 5/2011 | Ohtsuka |
| 8,163,588 B2 | 4/2012 | Mishima et al. |
| 8,411,187 B2 | 4/2013 | Watanabe et al. |
| 8,507,960 B2 | 8/2013 | Itonaga |
| 8,698,208 B2 | 4/2014 | Mishima et al. |
| 8,952,315 B2 | 2/2015 | Ohta et al. |
| 2011/0003426 A1* | 1/2011 | Watanabe ......... H01L 27/14609 438/73 |
| 2011/0079857 A1* | 4/2011 | Lee ................ H01L 21/823807 257/369 |
| 2012/0104501 A1 | 5/2012 | Anzai |
| 2012/0199893 A1* | 8/2012 | Okabe ............... H01L 27/14641 257/291 |
| 2013/0299887 A1 | 11/2013 | Itonaga |
| 2015/0147843 A1 | 5/2015 | Onuki et al. |

FOREIGN PATENT DOCUMENTS

| | | |
|---|---|---|
| JP | 2009-117681 A | 5/2009 |
| JP | 2010-109136 A | 5/2010 |
| JP | 2012-094672 A | 5/2012 |
| JP | 2014-072485 A | 4/2014 |

* cited by examiner

METHOD OF MANUFACTURING SOLID-STATE IMAGE SENSOR

BACKGROUND OF THE INVENTION

Field of the Invention

The present invention relates to a method of manufacturing a solid-state image sensor.

Description of the Related Art

Along with an increase in the number of pixels of a solid-state image sensor, fineness is required not only for a photoelectric conversion element but also for MOS transistors arranged in a pixel area and a peripheral circuit area. If the photoelectric conversion element and elements such as MOS transistors or the like are fined, the fineness of an active region where the elements are formed and an element isolation which isolates the active region is also required accordingly. An STI (Shallow Trench Isolation) is advantageous for a minute element isolation.

A layout is desired, which increases an area ratio made up by the photoelectric conversion element to ensure the sensitivity of the photoelectric conversion element even if the fineness of the pixels advances. Under such a requirement, a ratio occupied by the active region tends to be high, as compared with the peripheral circuit area, in the pixel area where a number of photoelectric conversion elements are arranged as periodic patterns. The difference of the occupancy ratio of the active region between the pixel area and the peripheral circuit area may have an influence on a planarizing process of eliminating a step between the active region and the element isolation. More specifically, the amount that the element isolation protrudes above the reference surface of the active region can be larger in the pixel area than in the peripheral circuit area. Note that the amount (height) that the element isolation protrudes above the reference surface of the active region is defined as a protrusion amount.

There is known a method called pre-etch which removes, before planarizing an insulating film where a trench for the element isolation is buried, a part of the insulating film in the active region by etching in order to reduce the difference of the protrusion amount between the pixel area and the peripheral circuit area. Adding this pre-etching process makes it possible to reduce the step after planarization even if the patterns having a different area occupancy ratio between the active region and the element isolation are mixed with each other.

Furthermore, there is proposed a technique of reducing the difference of the protrusion amount after planarization between the pixel area and the peripheral circuit area by making the distance between the end of the element isolation and the end of an opening formed on the active region by pre-etch smaller in the pixel area than in the peripheral circuit area (refer to Japanese Patent Laid-Open No. 2009-117681).

However, as the fineness of the pixels advances, the dimension of the active region in the pixel area decreases accordingly. If the dimension of the active region in the pixel area decreases, patterning of the insulating film on the active region by pre-etch becomes difficult. Even if patterning by pre-etch is possible, a method of controlling the distance between the end of the element isolation and the end of the opening formed by pre-etch has its limits. For example, if even a portion that should be left as the element isolation is etched by pre-etch, undesirable leakage may occur in the element isolation. It is therefore necessary to determine a rule of determining the positional relationship between a pre-etch pattern (opening pattern) and the active region in consideration of constraints such as variations in a processing dimension and a positional shift in pattern formation. As described above, if the fineness of the pixels advances, more constraints are imposed on the arrangement of the pre-etch pattern. This makes it difficult to sufficiently reduce the difference of the protrusion amount of the element isolations between the pixel area and the peripheral circuit area after planarization.

A problem caused when the protrusion amount becomes larger in the pixel area than in the peripheral circuit area is that an etching residue in an etching process of a gate electrode film may occur. The etching residue may occur especially in a portion where the step is large (that is, a boundary portion between the active region and the element isolation within the pixel area) before forming the gate electrode film.

SUMMARY OF THE INVENTION

One embodiment of the present invention provides a technique advantageous in decreasing a possibility that an etching residue will occur when patterning a gate electrode film of a pixel area.

One of aspects of the present invention provides a method of manufacturing a solid-state image sensor including a pixel area and a peripheral circuit area, the method comprising steps of: forming a first element isolation and a first active region of the pixel area in a semiconductor substrate, and forming a second isolation and a second active region of the peripheral circuit area in the semiconductor substrate; forming a gate electrode film so as to cover the first element isolation, the first active region, the second element isolation, and the second active region; implanting an n-type impurity selectively into at least a part of the gate electrode film corresponding to the pixel area; and forming, after the step of implanting the n-type impurity, a first gate electrode of the pixel area and a second gate electrode of the peripheral circuit area by patterning the gate electrode film, wherein the part of the gate electrode film includes a portion located above a boundary between the first element isolation and the first active region.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings.

A method of manufacturing a solid-state image sensor according to the first embodiment of the present invention will be described with reference to FIGS. 1 and 2. The solid-state image sensor includes a pixel area 101 where a plurality of pixels are arrayed and a peripheral circuit area 102 arranged on the periphery of the pixel area 101. Each pixel can include one or a plurality of photoelectric conversion elements 1, a floating diffusion, and one or a plurality of MOS transistors.

The one or the plurality of MOS transistors for each pixel can include, for example, a transfer MOS transistor which transfers charges generated and accumulated in the photoelectric conversion element 1 to the floating diffusion. In the pixel area, the plurality of pixels can be arrayed so as to form a plurality of rows and a plurality of columns. The pixel area 101 can include an amplification MOS transistor which outputs a signal corresponding to the potential of the floating diffusion, that is, a signal corresponding to an amount of the charges transferred to the floating diffusion. The amplification MOS transistor may be provided in each pixel or may be shared by the plurality of pixels.

The peripheral circuit area 102 can include, for example, a readout circuit configured to read out a signal from each pixel of the pixel area. The readout circuit can include, for example, a row selection unit which selects a row in the pixel area, a column selection unit which selects a column in the pixel area, and a processing unit which processes the signal from each pixel of the pixel area.

Figure 1:
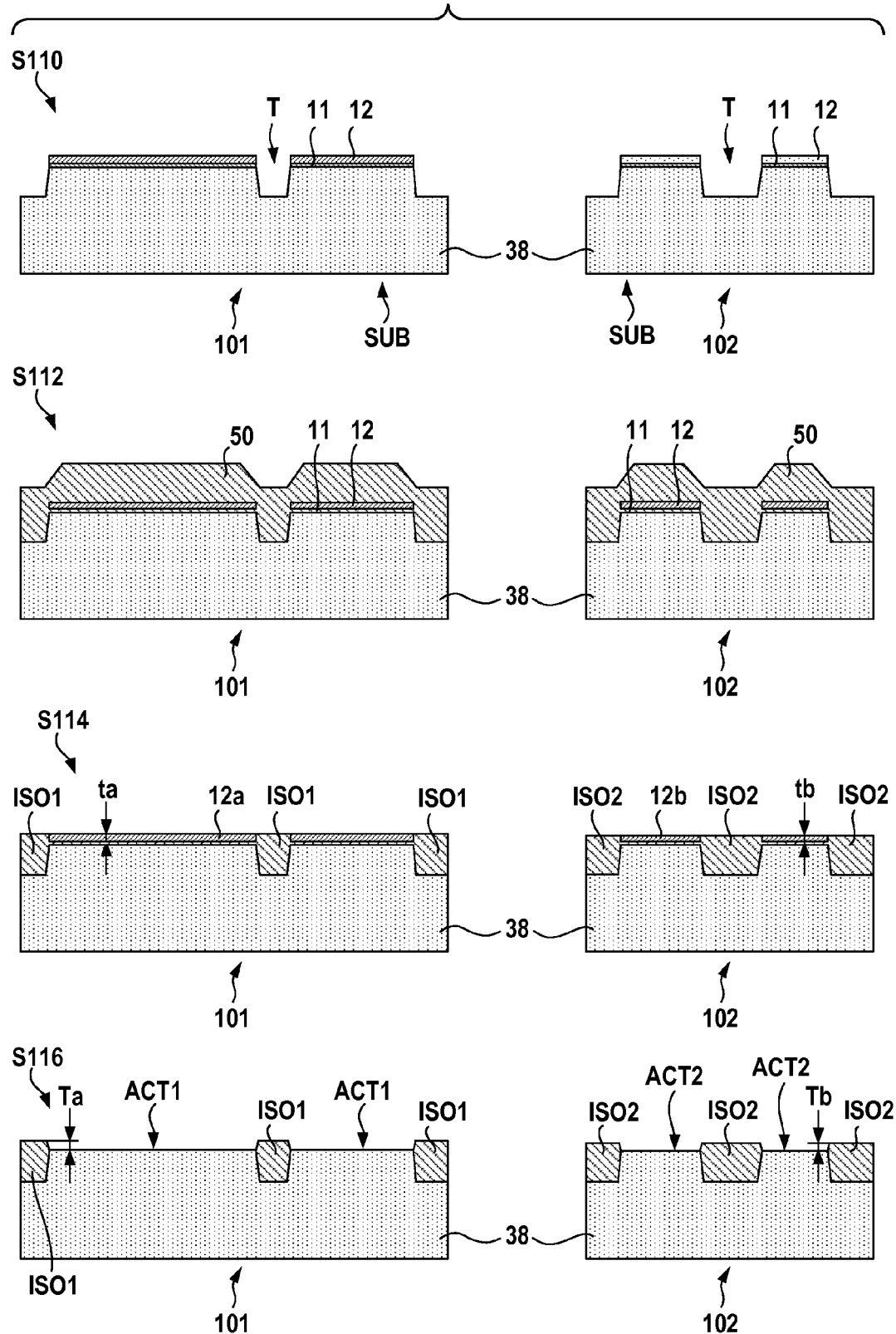
FIG. 1 shows a method of manufacturing a solid-state image sensor according to the first embodiment of the present invention.
Figure 2:
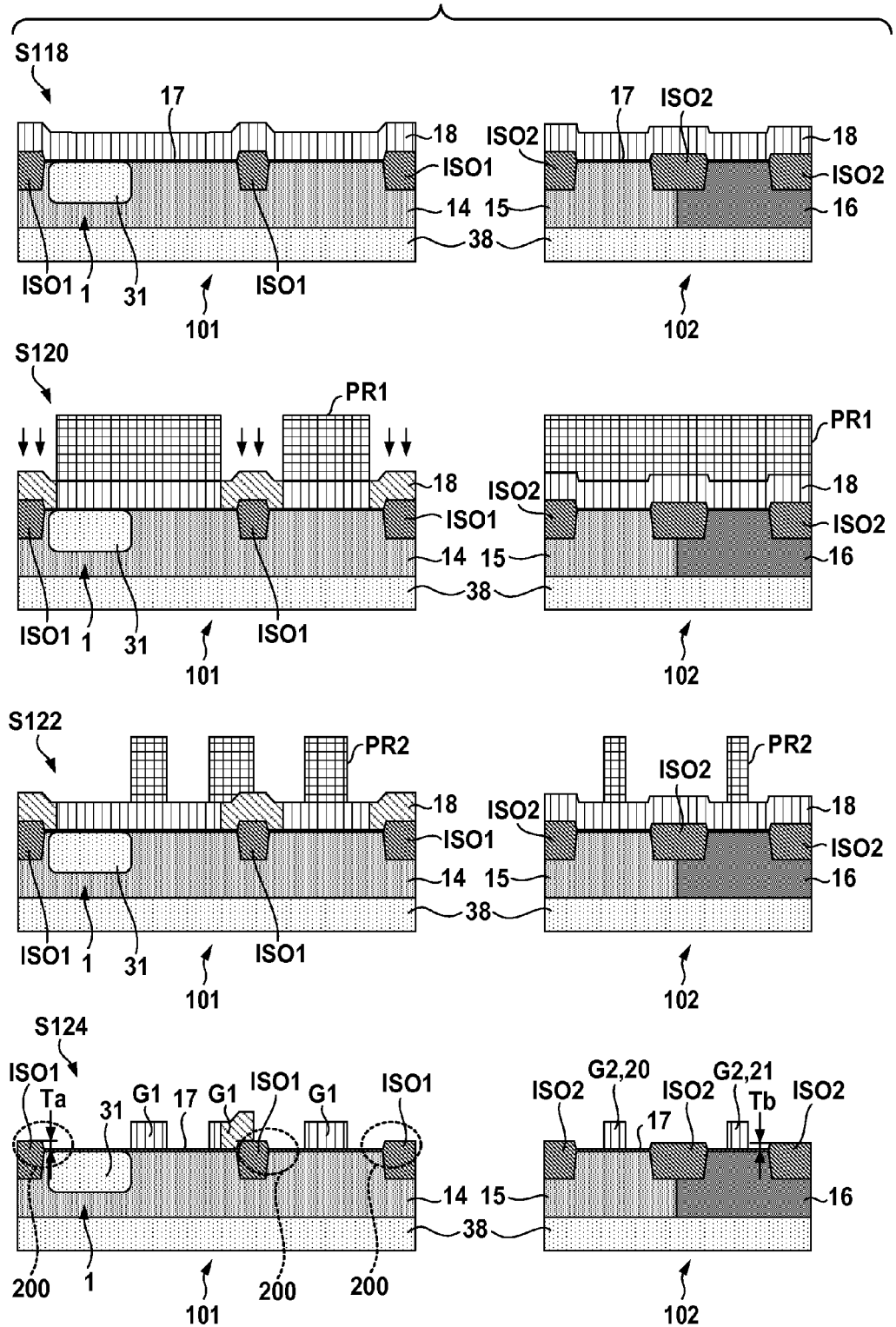
FIG. 2 shows the method of manufacturing the solid-state image sensor according to the first embodiment of the present invention.

In FIGS. 1 and 2, the pixel area 101 is a portion which schematically shows a part of the pixel area in the solid-state image sensor being manufactured and the peripheral circuit area 102 is a portion which schematically shows a part of the peripheral circuit area in the solid-state image sensor being manufactured. Note that in the following description, a word "substrate" means a structure including a semiconductor substrate SUB, for example, a structure including the semiconductor substrate SUB and a film formed thereon.

In steps S110 to S116, first element isolations ISO1 and first active regions ACT1 of the pixel area 101 are formed in the semiconductor substrate SUB, and second element isolations ISO2 and second active regions ACT2 of the peripheral circuit area 102 are formed in the semiconductor substrate SUB.

First, in step S110, the semiconductor substrate SUB including an n-type epitaxial layer 38 on its surface is prepared, and a silicon oxide film 11 and a silicon nitride film 12 are formed on the surface of the n-type epitaxial layer 38. Note that a polysilicon film may be formed as a buffer layer between the silicon oxide film 11 and the silicon nitride film 12. After that, a photoresist pattern is formed on the silicon nitride film 12. The silicon nitride film 12, the silicon oxide film 11, and the n-type epitaxial layer 38 are etched via the opening of the photoresist pattern, and a trench T is formed in the n-type epitaxial layer 38.

In step S112, the surface of the n-type epitaxial layer 38 exposed to the trench T is oxidized, and then the trench T is buried with silicon oxide 50 by a method such as a high-density plasma CVD method. At this time, a film of the silicon oxide 50 is also formed on the silicon nitride film 12 and a three-dimensional pattern is formed on a substrate surface. Before burying the trench T with the silicon oxide 50, a p-type impurity such as boron may be implanted into the trench T in order to suppress a dark current in the pixel area 101.

In step S114, an unnecessary portion of the silicon oxide 50 is removed and a planarizing process is performed to planarize the substrate surface. As a result, the first element isolations ISO1 are formed in the pixel area 101 and the second element isolations ISO2 are formed in the peripheral circuit area 102. The first and second element isolations ISO1 and ISO2 can be formed by STI (Shallow Trench Isolation). The planarizing process can include a CMP process. However, it may include the aforementioned pre-etching process (a step of forming the opening by etching the silicon oxide 50 on the active region) before the CMP process. In a general solid-state image sensor, however, the density of active regions is larger in the pixel area than in the peripheral circuit area, and a load applied to the planarizing process is larger in the pixel area than in the peripheral circuit area even if the pre-etching process is applied. This is because, as described above, the opening formed by pre-etch cannot be made large enough owing to the necessity to ensure the sufficient distance between the end of the opening and the end of the element isolation. Of the pixel area 101, regions other than the first element isolations ISO1 are the first active regions ACT1. Of the peripheral circuit area 102, regions other than the second element isolations ISO2 are the second active regions ACT2.

The planarizing process by the CMP process can be stopped by using the silicon nitride film 12 existing in the active regions ACT1 and ACT2 as a stopper. With the planarizing process, a silicon nitride film 12b in a partial region of the peripheral circuit area 102, where the load of planarizing process is smaller than in the pixel area 101, can be thinner than a silicon nitride film 12a of the pixel area 101. In FIG. 1, ta indicates the thickness of the silicon nitride film 12a in the pixel area 101 remaining after the planarizing process and tb indicates the thickness of the silicon nitride film 12b in the partial region of the peripheral circuit area 102 remaining after the planarizing process. A relation ta>tb can hold, as described above. However, it cannot always hold in the whole of the peripheral circuit area 102 because the density of active regions also varies locally in the peripheral circuit area 102.

In step S116, the silicon nitride films 12a and 12b existing in the active regions are removed using a wet process by a chemical solution such as phosphoric acid. The silicon oxide film 11 may also be removed using a chemical solution such as hydrofluoric acid. The chemical solution such as phosphoric acid for removing the silicon nitride films 12a and 12b has an etching rate of silicon oxide smaller than that of silicon nitride. Therefore, the first element isolations ISO1 and the second element isolations ISO2 are formed to protrude above the first active regions ACT1 and the second active regions ACT2. Letting Ta be the protrusion amount of the first element isolations ISO1 with respect to the first active regions ACT1 in the pixel area 101 and Tb be the protrusion amount of the second element isolations ISO2 with respect to the second active regions ACT2 in the peripheral circuit area 102, the relation Ta>Tb holds. This is because each thickness of the silicon nitride films 12a and 12b remaining after the planarizing process has an influence on the protrusion amount of the silicon oxide 50 in the element isolations ISO1 and ISO2. In FIG. 1, both Ta and Tb are illustrated to be positive. However, either one of them may be negative or both of them may have negative values.

As described above, the relational inequality Ta>Tb does not always hold in the whole of the peripheral circuit area 102 because the density of active regions also varies locally in the peripheral circuit area. However, a general solid-state image sensor has an arrangement in which the average protrusion amount of the element isolations with respect to the active regions is larger in the pixel area 101 than in the peripheral circuit area 102. Also from the viewpoint of the characteristics of the solid-state image sensor, it is preferable to control the protrusion amount to be larger in the pixel area 101 than in the peripheral circuit area 102 because a white defect and the dark current tends to increase if the protrusion amount in the pixel area 101 is shifted to be smaller.

In step S118, a p-type well region 14 of the pixel area 101, a p-type well region 15 of the peripheral circuit area 102, an n-type well region 16 of the peripheral circuit area 102, and an n-type semiconductor region (charge accumulation region) 31 which constitutes the photoelectric conversion element 1 of the pixel area 101 are formed. Also, in step S118, a gate insulating film 17 is formed, and then a gate electrode film 18 is deposited. The gate electrode film 18 contains the main component of a gate electrode of the MOS transistor. The main component of the gate electrode is, for example, a semiconductor material such as silicon or germanium. The gate electrode film 18 is a film made of the semiconductor material, that is, a semiconductor film. Alternatively, the gate electrode film 18 may be SiGe containing both silicon and germanium. The gate electrode is expected to function as an electric conductor rather than a semiconductor. Therefore, the gate electrode film 18 serving as the base material may be the semiconductor or the electric conductor if it is not an insulator. That is, the gate electrode film 18 is a non-insulator. The gate electrode film 18 immediately after deposition can be, for example, an undoped semiconductor film without a functional impurity except for an inevitable impurity. However, the gate electrode film 18 immediately after deposition may contain an impurity as long as it is possible to change the etching rate in accordance with a portion of the gate electrode film 18 when processing the gate electrode film 18, as will be described below. Furthermore, the gate electrode film 18 can be a polycrystalline or amorphous film. More specifically, the gate electrode film 18 can be an undoped polysilicon film or an undoped amorphous silicon film.

In step S120, a photoresist pattern PR1 is formed. The photoresist pattern PR1 has openings in at least some parts of portions corresponding to the pixel area 101. The at least some parts can include portions located above the boundary portions between the first element isolations ISO1 and the first active regions ACT1 or a part covering the whole and their peripheries of the first element isolations ISO1. The at least some parts may include at least a part of a portion where at least one first gate electrode (for example, the gate electrode of the amplification MOS transistor) of a plurality of first gate electrodes in the pixel area 101 is to be formed. Note that the photoresist pattern PR1 covers the whole of the peripheral circuit area 102. That is, the photoresist pattern PR1 has no opening in the peripheral circuit area 102. As is well known, a formation step of the photoresist pattern PR1 can include a formation process, an exposure process, and a developing process of the photoresist film.

Furthermore, in step S120, an n-type impurity is implanted into the gate electrode film 18 via each opening of the photoresist pattern PR1. That is, in step S120, the n-type impurity is implanted into, of the gate electrode film 18, at least each part of the portion corresponding to the pixel area 101. The n-type impurity implanted via each opening of the photoresist pattern PR1 in step S120 can include, for example, phosphorus or arsenic. The peripheral circuit area 102 may include a resistive element. In an implantation process of the n-type impurity in step S120, the n-type impurity may also be implanted into a part of the peripheral circuit area 102 such as a portion where the resistive element of the peripheral circuit area 102 is to be formed. After the implantation process of the n-type impurity, the photoresist pattern PR1 is removed.

In step S122, a photoresist pattern PR2 for patterning the gate electrode film 18 is formed. Then, the gate electrode film 18 is patterned by being etched via the openings of the photoresist pattern PR2, and first gate electrodes G1 of the pixel area and second gate electrodes G2 of the peripheral pixel area are formed. In an example shown in FIG. 2, the n-type impurity is also implanted, in step S120, into at least each part of the gate electrode of the amplification MOS transistor of the plurality of first gate electrodes G1 in the pixel area 101.

The following (1), (2), and (3) need to be satisfied to form the gate electrodes G1 and G2 by patterning the gate electrode film 18:

(1) ensuring etching selectivity with the gate insulating film 17 below the gate electrode film 18 and stopping etching by the gate insulating film 17;

(2) controlling the gate electrodes G1 and G2 to fall within a target dimensional range; and (3) generating no etching residue in the boundary portions between the element isolations and the active regions where the etching residue of the gate electrode film 18 is likely to occur.

Note that the protrusion amount of the element isolations tends to be larger in the pixel area 101 than in the peripheral circuit. Therefore, also in (1), (2), and (3), it is very important to suppress the etching residue when patterning (etching) the gate electrode film 18 in boundary portions 200 between the active regions and the element isolations of the pixel area 101. An area ratio in the solid-state image sensor is generally larger in the pixel area 101 than in the peripheral circuit area 102. Therefore, if the residue of the gate electrode film 18 occurs in the pixel area 101, a yield may further be decreased. Particularly, from the viewpoint of ensuring a high yield stably at the time of mass production, it is very important to ensure an etching residue margin when patterning the gate electrode film even if the protrusion amount of the element isolations varies to some extent.

When etching polysilicon, since electrons in the conduction band of polysilicon accelerate etching, the etching rate of n-type polysilicon is higher than that of undoped (i-type) polysilicon. It is also possible to raise the etching rate by increasing the implantation amount of the n-type impurity. In this embodiment, the n-type impurity is implanted into, of the gate electrode film 18, each boundary portion 200 between the active region and the element isolation of the pixel area in step S120. This makes it possible to make the etching rate in each boundary portion 200 where the etching residue is likely to occur higher than the average etching rate in the whole of the pixel area. This can decrease a possibility that the etching residue will occur in each boundary portion 200.

Figure 3:
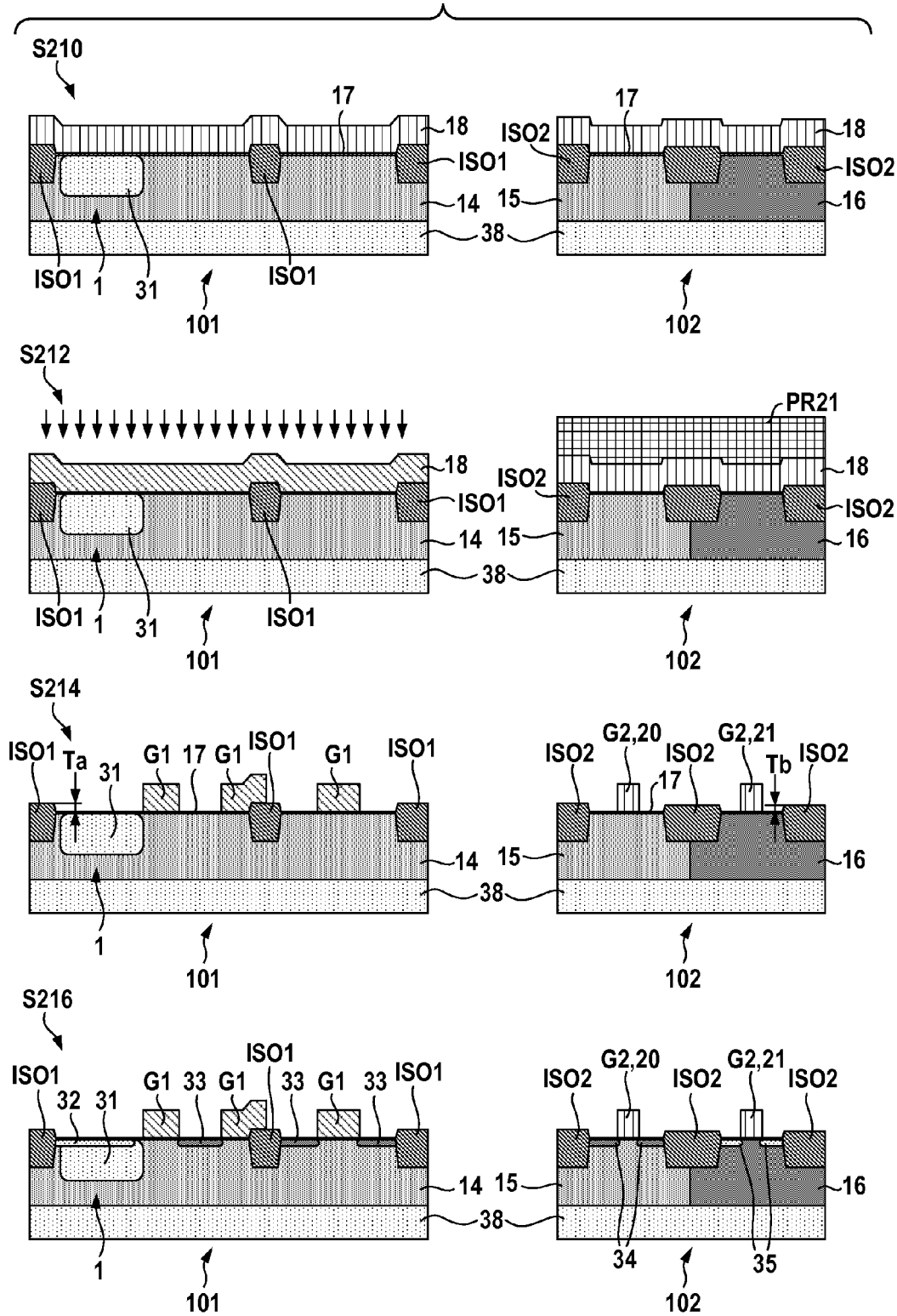
FIG. 3 shows a method of manufacturing a solid-state image sensor according to the second embodiment of the present invention.
Figure 4:
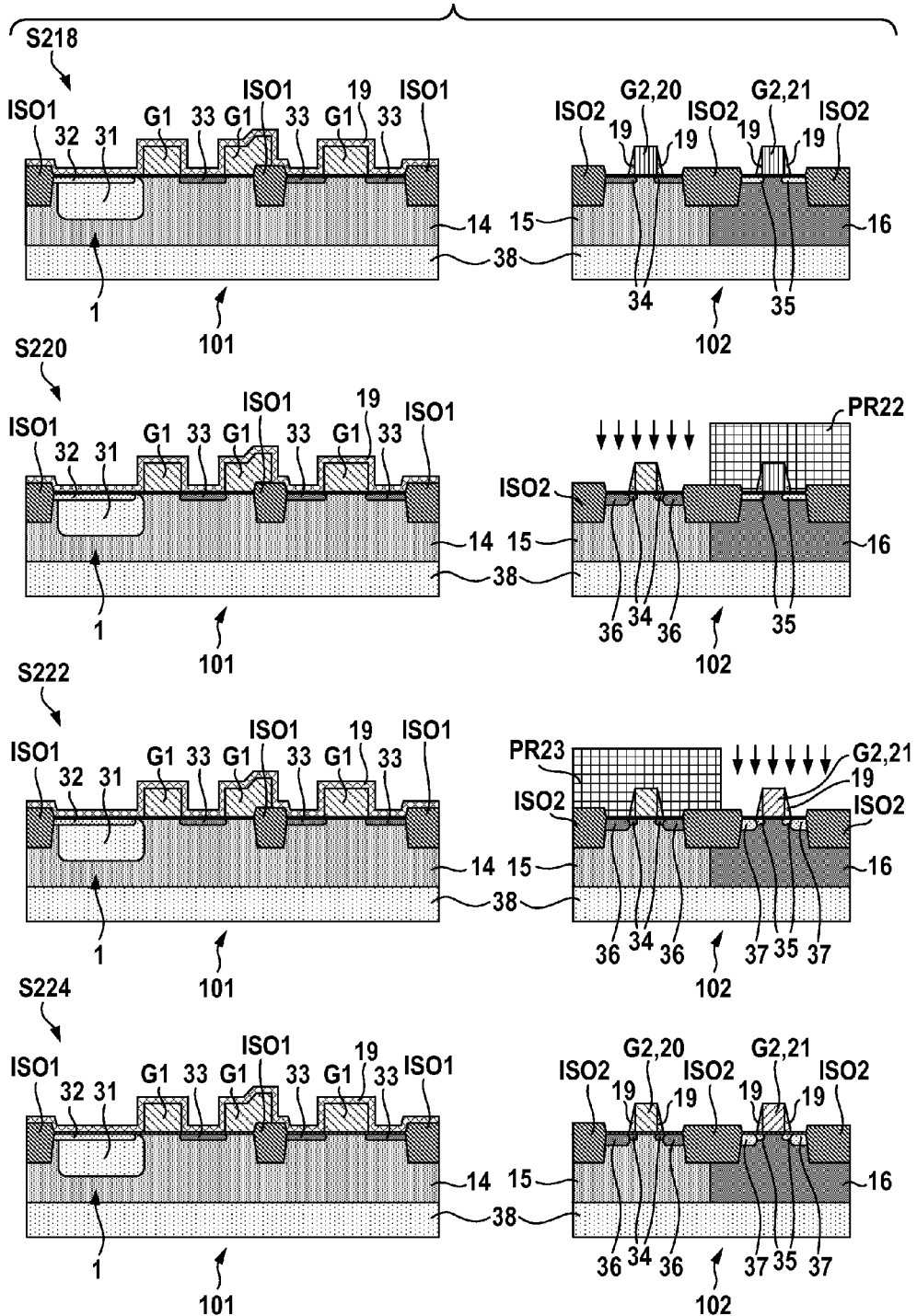
FIG. 4 shows the method of manufacturing the solid-state image sensor according to the second embodiment of the present invention.

A method of manufacturing a solid-state image sensor according to the second embodiment of the present invention will be described with reference to FIGS. 3 and 4. Matters that are not mentioned in the second embodiment can comply with the first embodiment. First, the same steps as steps S110 to S116 in the first embodiment are performed, and then step S210 is performed. Step S210 has the same operation as that of step S118 in the first embodiment.

In step S212, a photoresist pattern PR21 is formed. The photoresist pattern PR21 has openings in portions corresponding to the pixel area 101 and covers a peripheral circuit area 102. Furthermore, in step S212, an n-type impurity is implanted into a gate electrode film 18 via each opening of the photoresist pattern PR21. That is, in step S212, an n-type impurity is implanted into the whole part of the gate electrode film 18 corresponding to a pixel area 101.

In step S214, a photoresist pattern (not shown) for patterning the gate electrode film 18 is formed. Then, the gate electrode film 18 is patterned by being etched via the openings of the photoresist pattern, and first gate electrodes G1 of the pixel area 101 and second gate electrodes G2 of the peripheral pixel area 102 are formed. A possibility that an etching residue will occur when patterning the gate electrode film 18 can be decreased by implanting the n-type impurity into the whole part of the gate electrode film 18 within the pixel area 101 before etching the gate electrode film 18.

In this embodiment, an n-type semiconductor region 31 of the pixel area 101 forms a charge accumulation region where electrons are accumulated. That is, a photoelectric conversion element 1 of the pixel area 101 is an electron-accumulation type photoelectric conversion element. An electron-accumulation type solid-state image sensor can adopt an NMOS transistor as a MOS transistor of the pixel area 101. In this embodiment, it is possible to have the n-type first gate electrodes G1 of the NMOS transistor in the pixel area 101 by implanting an n-type impurity into the whole part of the gate electrode film 18 within the pixel area 101.

In step S216, in order to have the buried photoelectric conversion element 1, a p-type impurity is implanted onto the surface portion of the n-type semiconductor region 31 (semiconductor substrate SUB), thereby forming a p-type impurity layer 32. Also in step S216, an n-type impurity is implanted into regions where the source and drain of the MOS transistor in the pixel area 101 should be formed, thereby forming n-type impurity regions 33. The n-type impurity regions 33 have a single drain structure. Further, in step S216, n-type impurity diffusion regions 34 are formed as LDD regions of the source and drain of the NMOS transistor having an LDD (Lightly Doped Drain) structure in the peripheral circuit area 102. Furthermore, in step S216, p-type impurity diffusion regions 35 are formed as the LDD regions of the source and drain of the PMOS transistor having the LDD structure in the peripheral circuit area.

In step S218, insulating films 19 are formed, which cover the semiconductor substrate SUB where the first gate electrodes G1 and the second gate electrodes G2 have been formed. Then, in step S218, the insulating films 19 are etched so as to leave, of the insulating films 19, a portion corresponding to the pixel area 101 and portions where side spacers are formed on the side surfaces of the second gate electrodes G2. The insulating films 19 can be, for example, monolayer silicon oxide films. Alternatively, each insulating film 19 can have a two-layer structure of a silicon nitride layer or a silicon oxynitride layer and a silicon oxide layer. Alternatively, each insulating film 19 can have a three-layer structure of the silicon oxide layer, the silicon nitride layer or the silicon oxynitride layer, and the silicon oxide layer. The insulating film 19 can be made to function as an antireflection film on the photoelectric conversion element 1 by forming a multilayered structure including the silicon nitride layer or the silicon oxynitride layer.

In step S220, a photoresist pattern PR22 is formed, which covers a PMOS transistor region of the peripheral circuit area 102, and has openings in the pixel area 101 and an NMOS transistor region of the peripheral circuit area 102. Then, an n-type gate electrode 20 (second gate electrode G2), and n-type source and drain 36 are formed by implanting an n-type impurity such as phosphorus or arsenic into the NMOS transistor region via the opening at high concentrations. The n-type impurity is not implanted into the semiconductor substrate SUB and the first gate electrodes G1 of the pixel area 101 because they are covered with the insulating film 19.

In step S222, a photoresist pattern PR23 is formed, which covers the NMOS transistor region of the peripheral circuit area 102, and has openings in the pixel area 101 and the PMOS transistor region of the peripheral circuit area 102. Then, a p-type gate electrode 21 (second gate electrode G2), and p-type source and drain 37 are formed by implanting a p-type impurity such as boron into the PMOS transistor region via the opening at high concentrations. The p-type impurity is not implanted into the semiconductor substrate SUB and the first gate electrodes G1 of the pixel area 101 because they are covered with the insulating film 19.

With the above-described method, a so-called dual gate electrode is formed, in which the NMOS transistor includes the n-type gate electrode 20 and the PMOS transistor includes a p-type gate electrode 21.

In this embodiment, the p-type impurity is implanted after implanting the n-type impurity. However, the implantation order is not limited to this and can be changed. Furthermore, in this embodiment, a step of implanting the impurity into each gate electrode of the peripheral circuit area, and a step of implanting the impurity into the regions where the source and drain should be formed are performed simultaneously. However, these steps may be performed separately. In this case, implantation energy and a dose amount can be determined freely in the separate steps.

After steps S222 and S224, an annealing process for recovering a crystal defect caused by implanting an impurity at a high concentration and activating the impurity that has been implanted can be performed.

In this embodiment, the MOS transistor of the pixel area has a single drain structure and the MOS transistor of the peripheral circuit area has an LDD structure. However, both the MOS transistor of the pixel area and the MOS transistor of the peripheral circuit area may have LDD structures.

Figure 5:
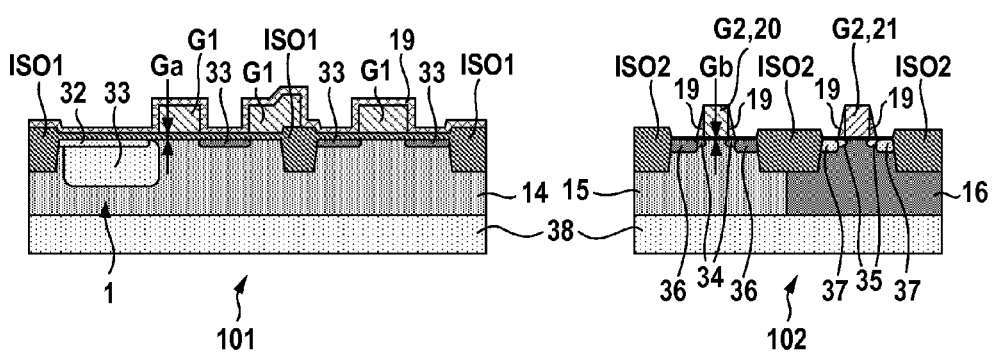
FIG. 5 shows a method of manufacturing a solid-state image sensor according to the third embodiment of the present invention.

A method of manufacturing a solid-state image sensor according to the third embodiment of the present invention will be described with reference to FIG. 5. In the third embodiment, the gate insulating film 17 in each of the first and second embodiments is replaced by a first gate insulating film 17a and a second gate insulating film 17b. The first gate insulating film 17a is a gate insulating film of a pixel area 101 and the second gate insulating film 17b is a gate insulating film of a peripheral circuit area 102. A thickness Ga of the first gate insulating film 17a is larger than a thickness Gb of the second gate insulating film 17b.

Such an arrangement is obtained by, for example, selectively removing the gate insulating film of the peripheral circuit area 102 by wet etching, and then forming the second gate insulating film 17b after forming the gate insulating film having the thickness Ga in the whole of a semiconductor substrate SUB.

In the third embodiment, an n-type impurity is selectively implanted into, of a gate electrode film 18, at least each part of a portion corresponding to the pixel area 101 before patterning the gate electrode film 18, as in the first and second embodiments. This decreases a possibility that an etching residue will occur when etching the gate electrode film 18 in the pixel area 101 having a larger protrusion amount than at least each part of the peripheral circuit area 102. On the other hand, when etching the gate electrode film 18, etching needs to be stopped by the first gate insulating film 17a serving as the underlying film of the gate electrode film 18. The gate electrode film 18 is etched earlier in the pixel area 101 than in the peripheral circuit area 102, thus posing a problem of over-etching the first gate insulating film 17a serving as the underlying film. A tradeoff relationship exists between etching residues generated at the time of over-etching of the first gate insulating film 17a and etching of the gate electrode film 18. Because a relation Ga>Gb holds for such a problem, a possibility that the surface of the semiconductor substrate SUB is exposed in the pixel area 101 by over-etching the first gate insulating film 17a when etching the gate electrode film 18 can be decreased.

It is possible to differentiate the power supply voltage of the pixel area 101 from a power supply voltage used in some circuits on the peripheral circuit area 102 by causing the pixel area 101 and the peripheral circuit area 102 to causes the gate insulating film to have different thicknesses.

Also in the third embodiment, the etching rate of the gate electrode film in at least each part (for example, each boundary portion between an element isolation and an active region where the etching residue is likely to occur) of the pixel area can be higher than that in the peripheral circuit area.

Figure 6:
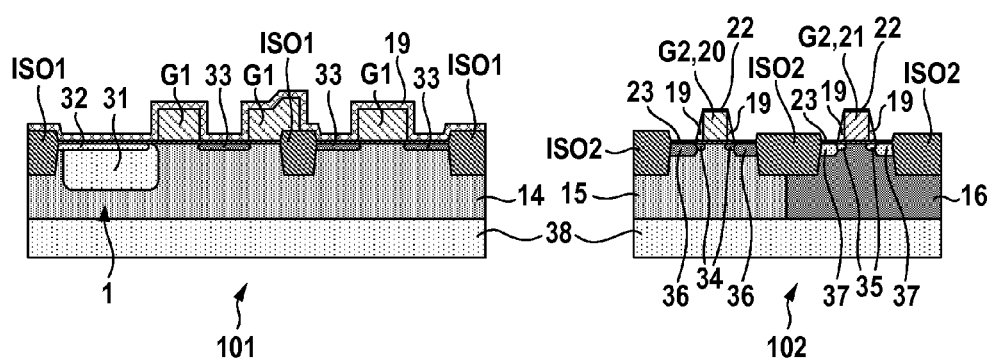
FIG. 6 shows a method of manufacturing a solid-state image sensor according to the fourth embodiment of the present invention.

A method of manufacturing a solid-state image sensor according to the fourth embodiment of the present invention will be described with reference to FIG. 6. Matters that are not mentioned in the fourth embodiment can comply with the first to third embodiments. In the fourth embodiment, at least some MOS transistors in a peripheral circuit area 102 include metal-semiconductor compound layers (metal silicide layers). On the other hand, a MOS transistor in a pixel area 101 does not include a metal-semiconductor compound layer containing the same metal component as that of the metal-semiconductor compound layer of each MOS transistor in the peripheral circuit area 102.

An insulating film 19 covering first gate electrodes G1 and a semiconductor substrate SUB in the pixel area 101 can function as a protective film which prevents formation of a metal-semiconductor compound layer. In the peripheral circuit area 102, metal-semiconductor compound layers 22 are formed on the upper layers of a gate electrodes 20 and 21, and metal-semiconductor compound layers 23 are formed on the surface layers of the source and drain by using a method called a salicide (self-aligned silicide). Each of the metal-semiconductor compound layers 22 and 23 can be formed by, for example, a cobalt silicide. However, a metal and a semiconductor that form each metal-semiconductor compound layer may be another metal such as nickel and a semiconductor other than silicon. The metal which forms each of the metal-semiconductor compound layers 22 and 23 can be a metal other than a metal contained in an electrically conductive member (a contact plug or an interconnection) connected to the MOS transistor. If, for example, the metal contained in the electrically conductive member is tungsten, titanium, tantalum, copper, or aluminum, each of the metal-semiconductor compound layers 22 and 23 is a compound layer of the semiconductor and the metal other than these (for example, cobalt or nickel). The MOS transistor of the pixel area 101 does not include the compound layer of the semiconductor and the metal other than the metal component contained in the electrically conductive member connected to the MOS transistor of the pixel area 101. A part of the MOS transistor in the pixel area 101 can react with the metal such as titanium or tungsten contained in the electrically conductive member connected to the MOS transistor of the pixel area 101. As a result, the MOS transistor of the pixel area 101 can include a portion made of a metal-semiconductor compound of the metal contained in the electrically conductive member and the semiconductor of the MOS transistor. In this embodiment, each insulating film 19 can be used as the protective film for preventing formation of the metal-semiconductor compound layer. However, the protective layer may be formed by patterning a film different from each insulating film 19 that has been formed in a separate step.

According to this embodiment, it is possible, in addition to reducing the etching residue of the gate electrode film in the pixel area, to improve the characteristics of the transistors by introducing the metal-semiconductor compound layers.

Figure 7:
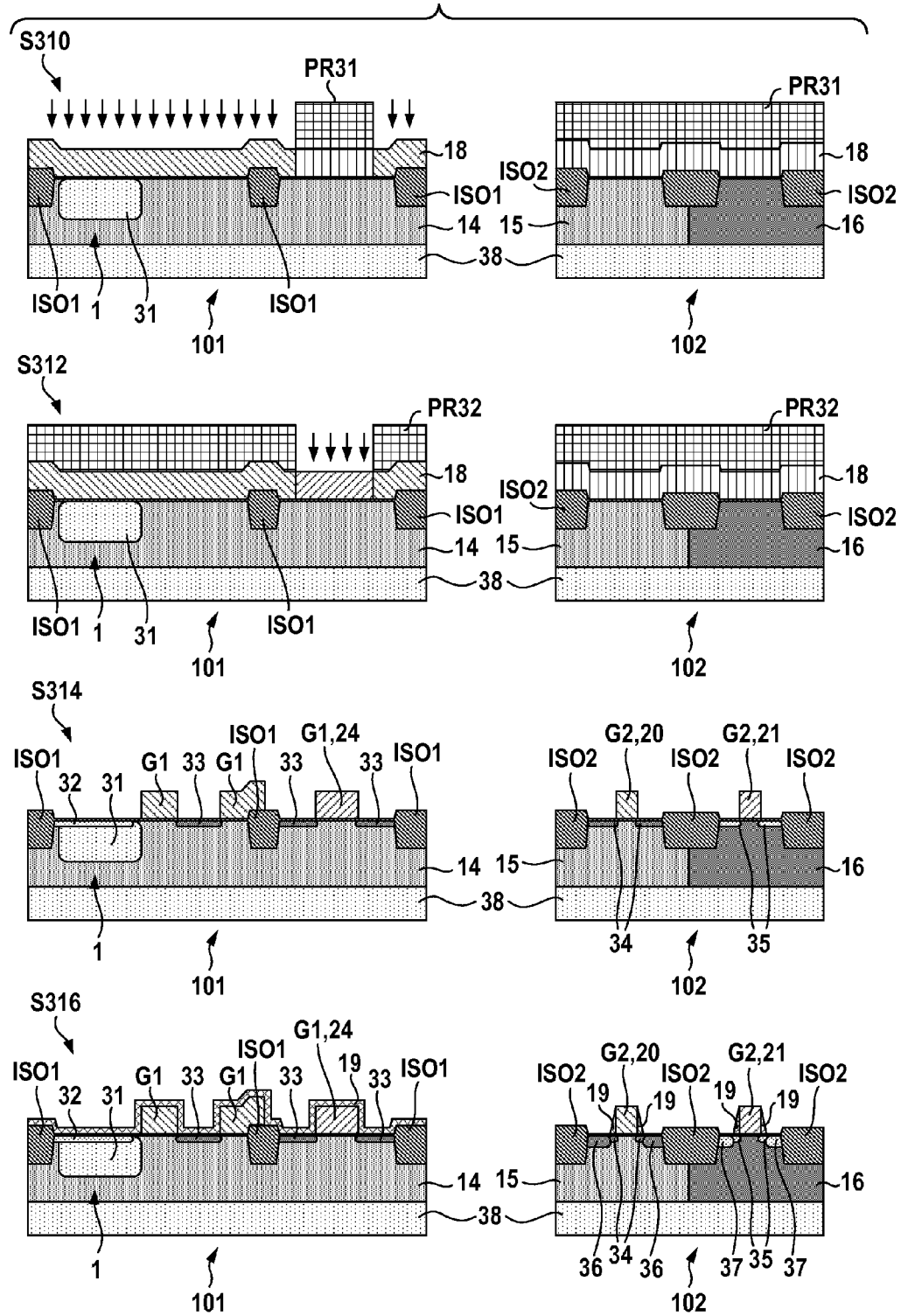
FIG. 7 shows a method of manufacturing a solid-state image sensor according to the fifth embodiment of the present invention.

A method of manufacturing a solid-state image sensor according to the fifth embodiment of the present invention will be described with reference to FIG. 7. Matters that are not mentioned in the fifth embodiment can comply with the first to fourth embodiments. First, the same steps as steps S110 to S118 in the first embodiment are performed, and then step S310 is performed.

In step S310, a photoresist pattern PR31 is formed. The photoresist pattern PR31 has the first opening in each part of a portion corresponding to a pixel area 101, and covers the other part of the pixel area 101 and a peripheral circuit area 102. The at least each part can include a portion located above each boundary portion between a first element isolation ISO1 and a first active region ACT1 or a region covering the whole of the first element isolations ISO1 and their peripheries of the first element isolations ISO1. Furthermore, in step S310, an n-type impurity is implanted into a gate electrode film 18 via each first opening of the photoresist pattern PR31. That is, in step S310, the n-type impurity is implanted into, of the gate electrode film 18, at least each part of the portion corresponding to a pixel area 101. After that, the photoresist pattern PR31 is removed.

In step S312, a photoresist pattern PR32 is formed. The photoresist pattern PR32 has the second opening in a part of a portion corresponding to the pixel area 101, and covers other parts of the pixel area 101 and the peripheral circuit area 102. Note that the area of the first openings is larger than that of the second opening. The first openings and the second opening may partially overlap with each other or may not include an overlapping region. Furthermore, in step S312, a p-type impurity is implanted into a gate electrode film 18 via the second opening of the photoresist pattern PR32. That is, in step S312, the p-type impurity is implanted into, of the gate electrode film 18, at least the part of the portion corresponding to the pixel area. After that, the photoresist pattern PR32 is removed. Note that the portion, of the gate electrode film 18, into which the p-type impurity is implanted can be, for example, a portion serving as a gate electrode 24 of an amplification MOS transistor.

In step S314, a photoresist pattern (not shown) for patterning the gate electrode film 18 is formed. Then, the gate electrode film 18 is patterned by being etched via the openings of the photoresist pattern, and first gate electrodes G1 of the pixel area 101 and second gate electrodes G2 of the peripheral pixel area 102 are formed.

As described above, the etching rate of n-type polysilicon is higher than that of undoped (i-type) polysilicon and becomes higher as the implantation amount of the n-type impurity increases. On the other hand, although the etching rate of p-type polysilicon is slightly lower than that of undoped (i-type) polysilicon, it can be considered almost equal. Therefore, if an etching condition is set relative to the etching rate of p-type polysilicon, an etching condition on which a residue is less likely to occur as compared with p-type polysilicon can be set for n-type or undoped polysilicon. Additionally, an etching condition on which a process margin for occurrence of the etching residue is improved greatly can be set for n-type polysilicon.

One cause of occurrence of the difference in the etching rate between n-type polysilicon and i-type or p-type polysilicon will be described. In a plasma used for etching, more positive ions serving as an etchant are attracted to an n-type portion where a majority carrier is an electron than to a p-type or i-type portion. That is, a larger amount of an etching gas is supplied to the n-type portion than to the p-type or i-type portion. It is therefore considered that the etching rate is higher in the n-type portion than in the other portions. The gate electrode film 18 itself is also considered as one cause because the etching rate tends to be higher as the impurity contained in it increases. It is found from these reasons that a phenomenon in which the etching rate is higher, of the gate electrode film 18, in the n-type portion than in the i-type or p-type portion is not attributed to the film quality and the main component of the gate electrode film 18, and the type of impurity. It is therefore possible to apply this embodiment to the gate electrode film 18 even if it is not formed from polysilicon or amorphous silicon.

In the above-described embodiments, structures such as an interconnection layer, a color filter, and a microlens have not been described. However, a solid-state image sensor can include the interconnection layer, the color filter, and/or the microlens.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-121849, filed Jun. 12, 2014, which is hereby incorporated by reference herein in its entirety.

What is claimed is:

1. A method of manufacturing a solid-state image sensor including a pixel area and a peripheral circuit area, the method comprising:
forming a first element isolation and a first active region of the pixel area in a semiconductor substrate, and forming a second element isolation and a second active region of the peripheral circuit area in the semiconductor substrate;
forming a gate electrode film so as to cover the first element isolation, the first active region, the second element isolation, and the second active region;
implanting an n-type impurity into at least a first part of the gate electrode film in the pixel area in a state that at least a second part of the gate electrode film in the peripheral circuit area is covered with a mask; and
forming, by patterning the gate electrode film in a state that an impurity concentration is higher in the first part than in the second part after the implanting of the n-type impurity, a first gate electrode of a MOS transistor in the pixel area from the first part, and a second gate electrode of an NMOS transistor in the peripheral circuit area from the second part,
wherein the first part of the gate electrode film includes a portion located above a boundary between the first element isolation and the first active region.

2. The method according to claim 1, further comprising implanting an n-type impurity into the second gate electrode after the forming of the first gate electrode and the second gate electrode, wherein no n-type impurity is implanted into the second part of the gate electrode film between the forming of the gate electrode film and the patterning.

3. The method according to claim 2, wherein, between the forming of the gate electrode film and the patterning, an impurity is implanted into a part of the peripheral circuit area.

4. The method according to claim 1, further comprising implanting an n-type impurity into the second gate electrode after the forming of the first gate electrode and the second gate electrode, wherein in the implanting of the n-type impurity into the second gate electrode, an n-type impurity is also implanted into the semiconductor substrate such that a source and a drain of the NMOS transistor are formed.

5. The method according to claim 4, further comprising:
forming, after the forming of the first gate electrode and the second gate electrode, an insulating film which covers the first gate electrode and the second gate electrode; and
etching the insulating film so as to leave a portion of the insulating film in the pixel area and a portion as a side spacer on a side surface of the second gate electrode,
wherein the implanting of the n-type impurity into the second gate electrode is performed after the etching of the insulating film.

6. The method according to claim 5, wherein the first gate electrode and at least a part of the semiconductor substrate in the pixel area are covered with the insulating film when the implanting of the n-type impurity into the semiconductor substrate is performed.

7. The method according to claim 1, wherein in the implanting of the n-type impurity, the n-type impurity is implanted into a whole part of the gate electrode film corresponding to the pixel area.

8. The method according to claim 1, wherein the pixel area includes a plurality of gate electrodes of a plurality of NMOS transistors, including the MOS transistor, and
wherein the first part further includes at least a part of a portion where at least one gate electrode of the plurality of gate electrodes in the pixel area is to be formed.

9. The method according to claim 8, wherein the at least one gate electrode includes a gate electrode of an amplification MOS transistor.

10. The method according to claim 1, wherein in the forming of the gate electrode film, an undoped semiconductor film is formed as the gate electrode film.

11. The method according to claim 1, wherein each of the first element isolation and the second element isolation is an STI (Shallow Trench Isolation).

12. The method according to claim 1, further comprising, before the forming of the gate electrode film, forming a first gate insulating film of the pixel area and a second gate insulating film of the peripheral circuit area,
wherein the first gate insulating film is thicker than the second gate insulating film.

13. The method according to claim 1, wherein the MOS transistor of the pixel area has a single drain structure and the NMOS transistor of the peripheral circuit area has an LDD (Lightly Doped Drain) structure.

14. The method according to claim 1, wherein the NMOS transistor of the peripheral circuit area includes a metal-semiconductor compound layer and the MOS transistor of the pixel area does not include a metal-semiconductor compound layer containing the same metal component as that of the metal-semiconductor compound layer.

15. The method according to claim 1, wherein in the implanting of the n-type impurity into at least the first part of the gate electrode film in the pixel area, a third part of the gate electrode film in the peripheral circuit area is masked,
  wherein, in the forming of the first gate electrode and the second gate electrode, a third gate electrode of a PMOS transistor in the peripheral circuit area is formed from the third part,
  wherein the method further comprises implanting a p-type impurity into the semiconductor substrate such that a source and a drain of the PMOS transistor are formed, and
  wherein, in the implanting of the p-type impurity, the p-type impurity is also implanted in the third gate electrode of the PMOS transistor.

16. The method according to claim 15, wherein no p-type impurity is implanted into the third part of the gate electrode film between the forming of the gate electrode film and the patterning.

17. A method of manufacturing a solid-state image sensor including a pixel area and a peripheral circuit area, the method comprising:
  forming a first element isolation and a first active region of the pixel area in a semiconductor substrate, and forming a second element isolation and a second active region of the peripheral circuit area in the semiconductor substrate;
  forming a gate electrode film so as to cover the first element isolation, the first active region, the second element isolation, and the second active region;
  implanting an n-type impurity into at least a first part of the gate electrode film in the pixel area in a state that at least a second part of the gate electrode film in the peripheral circuit area is covered with a mask,
  the first part including a portion located above a boundary portion between the first element isolation and the first active region;
  implanting a p-type impurity into, of the gate electrode film in the pixel area, a portion different from the portion located above the boundary portion between the first element isolation and the first active region; and
  forming, by patterning the gate electrode film after the implanting of the n-type impurity, a first gate electrode of a MOS transistor in the pixel area from the first part, and a second gate electrode of an NMOS transistor in the peripheral circuit area from the second part.

18. The method according to claim 17, wherein the implanting of the p-type impurity is performed before the forming of the first gate electrode and the second gate electrode.

19. The method according to claim 17, wherein the pixel area includes an amplification transistor, and
  wherein the method further comprises implanting a p-type impurity into a portion where a gate electrode of the amplification transistor is to be formed.

20. A method of manufacturing a solid-state image sensor including a pixel area and a peripheral circuit area, the method comprising:
  forming a first element isolation and a first active region of the pixel area in a semiconductor substrate, and forming a second element isolation and a second active region of the peripheral circuit area in the semiconductor substrate;
  forming a gate electrode film so as to cover the first element isolation, the first active region, the second element isolation, and the second active region;
  implanting an n-type impurity into at least a first part of the gate electrode film in the pixel area in a state that at least a second part of the gate electrode film in the peripheral circuit area is covered with a mask; and
  forming, by patterning the gate electrode film after the implanting of the n-type impurity, a first gate electrode of a MOS transistor in the pixel area from the first part, and a second gate electrode of an NMOS transistor in the peripheral circuit area from the second part,
  wherein the first part of the gate electrode film includes a portion located above a boundary between the first element isolation and the first active region,
  wherein each of the first element isolation and the second element isolation is an STI (Shallow Trench Isolation),
  wherein a protrusion amount of the first element isolation with respect to a reference surface of the first active region is larger than a protrusion amount of the second element isolation with respect to a reference surface of the second active region, and
  wherein the forming of the first gate electrode and the second gate electrode is performed such that an etching rate of the first part of the gate electrode film is higher than an etching rate of the second part of the gate electrode film.

* * * * *